(12) United States Patent
Guo et al.

(10) Patent No.: US 8,188,573 B2
(45) Date of Patent: May 29, 2012

(54) NITRIDE SEMICONDUCTOR STRUCTURE

(75) Inventors: Yih-Der Guo, Hsinchu (TW); Suh-Fang Lin, Hsinchu (TW); Wei-Hung Kuo, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 129 days.

(21) Appl. No.: 12/584,942

(22) Filed: Sep. 14, 2009

(65) Prior Publication Data
US 2010/0090312 A1    Apr. 15, 2010

Related U.S. Application Data

(63) Continuation-in-part of application No. 11/554,603, filed on Oct. 31, 2006, now Pat. No. 7,772,595.

(30) Foreign Application Priority Data

Aug. 31, 2006  (TW) ............................... 95132153 A
Mar. 23, 2009  (TW) ............................... 98109393 A
Mar. 23, 2009  (TW) ............................... 98109394 A

(51) Int. Cl.
*H01L 29/20* (2006.01)

(52) U.S. Cl. ......... 257/615; 257/E33.025; 257/E33.028; 257/E21.097; 257/E21.098; 257/E21.099; 257/E21.108; 257/E21.112; 257/E21.117; 257/E21.118; 257/E21.124; 257/E21.126; 117/952; 438/481

(58) Field of Classification Search .................... 117/952
See application file for complete search history.

(56) References Cited

U.S. PATENT DOCUMENTS

| | | | |
|---|---|---|---|
| 5,919,305 A | 7/1999 | Solomon | |
| 6,559,075 B1 | 5/2003 | Kelly et al. | |
| 6,582,986 B2 | 6/2003 | Kong et al. | |
| 6,686,257 B1 | 2/2004 | Wu et al. | |
| 6,740,604 B2 | 5/2004 | Kelly et al. | |
| 2001/0026950 A1* | 10/2001 | Sunakawa et al. | 438/47 |
| 2001/0053618 A1* | 12/2001 | Kozaki et al. | 438/933 |
| 2004/0021401 A1* | 2/2004 | Ando | 310/344 |
| 2004/0251519 A1* | 12/2004 | Sugahara et al. | 257/615 |
| 2009/0274883 A1* | 11/2009 | Liu et al. | 428/201 |

FOREIGN PATENT DOCUMENTS

WO    2007107757    9/2007

* cited by examiner

*Primary Examiner* — Davienne Monbleau
*Assistant Examiner* — Fei Fei Yeung Lopez
(74) *Attorney, Agent, or Firm* — J.C. Patents

(57) ABSTRACT

A nitride semiconductor substrate and a method for manufacturing the same are provided. The nitride semiconductor substrate includes an epitaxy substrate, a nitride pillar layer, a nitride semiconductor layer, and a mask layer. The nitride pillar layer includes a plurality of first patterned arranged pillars and a plurality of second patterned arranged pillars. The nitride pillar layer is formed on the epitaxy substrate. A width of a cross-section of each of the second patterned arranged pillars is smaller than a width of a cross-section of each of the first patterned arranged pillars, and a distance among each of the second patterned arranged pillars is longer than a distance among each of the first patterned arranged pillars. Surfaces of the epitaxy substrate, the first patterned arranged pillars, and the second patterned arranged pillars are covered by the mask layer. The nitride semiconductor layer is formed on the nitride pillar layer.

13 Claims, 18 Drawing Sheets

NITRIDE SEMICONDUCTOR STRUCTURE

CROSS-REFERENCE TO RELATED APPLICATION

This application is a continuation-in-part of and claims the priority benefit of U.S. application Ser. No. 11/554,603, filed on Oct. 31, 2006, which claims the priority benefit of Taiwan application Ser. No. 95132153, filed on Aug. 31, 2006. This application also claims the priority benefit of Taiwan application serial no. 98109394, filed on Mar. 23, 2009 and Taiwan application serial no. 98109393, filed on Mar. 23, 2009. The entirety of each of the above-mentioned patent applications is hereby incorporated by reference herein and made a part of this specification.

BACKGROUND OF THE INVENTION

1. Field of the Invention

The present application relates to a nitride semiconductor structure and a method for manufacturing the same.

2. Description of Related Art

In recent years, light emitting diodes (LEDs) and laser diodes (LDs) are now prevailing in commercial use. For instance, a mixture of blue and yellow phosphor powder made of gallium nitride (GaN) is capable of generating white light, which leads to high luminance and substantially low power consumption in comparison with a conventional light bulb. In addition, the LED has a lifetime of more than tens of thousand hours, longer than that of the conventional light bulb.

In the process of manufacturing a GaN semiconductor light-emitting element, due to difference in lattice constants and thermal expansion coefficients between a GaN semiconductor layer and an epitaxy substrate, the GaN semiconductor easily encounters the problems of threading dislocation and thermal stresses during an epitaxy process, which deteriorates luminance efficiency of the light-emitting element.

According to the related art, a method of separating the GaN semiconductor layer from the epitaxy substrate includes applying an irradiating method whereby laser beams pass through a substrate and illuminate an interlayer between the substrate and the GaN semiconductor layer. Thus, the GaN semiconductor layer and the epitaxy substrate are separated. Moreover, a wet etching method can also be performed to directly remove a barrier structure between the substrate and the GaN semiconductor layer so as to weaken a connection structure therebetween and to further separate the GaN semiconductor layer from the epitaxy substrate. In addition, a vapor phase etching process can be performed at a high temperature to directly remove the interlayer between the GaN semiconductor layer and the epitaxy substrate. Thus, the GaN semiconductor layer and the epitaxy substrate are separated.

For instance, in U.S. Pat. No. 6,582,986, a method of forming a GaN semiconductor layer by pendeo-epitaxy is disclosed. This method is adapted for being applied to materials apt to be etched, e.g., a carbon silicon substrate, while stresses are prone to be concentrated at a buffer layer which is located between the epitaxy substrate and the GaN semiconductor layer and serves as a seed.

On the other hand, in PCT publication no. WO2007/107757, a method of adjusting epitaxy parameters is provided. As indicated in FIG. 1, an epitaxy process is performed directly on an epitaxy substrate 100 to form a GaN nanocolumn 102 on a nitride layer 101. Next, by using the GaN nanocolumn 102 as a seed, an epitaxial lateral over growth (ELOG) process is performed to form a GaN semiconductor thick film 104. A cooling process is then carried out to crack an interface between the GaN semiconductor layer 104 and the epitaxy substrate 100. Thereafter, a mechanical force is applied to separate a GaN thick film from the GaN semiconductor layer 104 and the epitaxy substrate 100.

SUMMARY OF THE INVENTION

In an embodiment of the present invention, a nitride semiconductor substrate including an epitaxy substrate, a nitride pillar layer, a nitride semiconductor layer, and a mask layer is provided. The nitride pillar layer includes first patterned arranged pillars and second patterned arranged pillars. The nitride pillar layer is formed on the epitaxy substrate. A width of a cross-section of each of the second patterned arranged pillars is smaller than a width of a cross-section of each of the first patterned arranged pillars, and a distance among each of the second patterned arranged pillars is longer than a distance among each of the first patterned arranged pillars. Surfaces of the epitaxy substrate, the first patterned arranged pillars, and the second patterned arranged pillars are covered by the mask layer. The nitride semiconductor layer is formed on the nitride pillar layer.

In another embodiment of the present invention, a method of manufacturing a nitride semiconductor substrate is provided. In the method, a plurality of first patterned arranged pillars are formed on a surface of an epitaxy substrate, and a mask layer covering sidewalls and parts of top surfaces of the first patterned arranged pillars is formed on the surface of the epitaxy substrate. Next, a plurality of second patterned arranged pillars are formed on the first patterned arranged pillars. Here, a width of a cross-section of each of the second patterned arranged pillars is smaller than a width of a cross-section of each of the first patterned arranged pillars, and a distance among each of the second patterned arranged pillars is longer than a distance among each of the first patterned arranged pillars. An ELOG (epitaxial lateral over growth) process is then performed on the second patterned arranged pillars to form a nitride semiconductor layer.

In yet another embodiment of the present invention, a nitride semiconductor substrate including an epitaxy substrate, a patterned nitride semiconductor pillar layer, a nitride semiconductor layer, and a mask layer is provided. The nitride semiconductor pillar layer includes a plurality of first patterned arranged hollow structures and a plurality of second patterned arranged hollow structures formed among the first patterned arranged hollow structures. The second patterned arranged hollow structures have nano dimensions. The nitride semiconductor pillar layer is formed on the epitaxy substrate, and the nitride semiconductor layer is formed on the nitride semiconductor pillar layer. The mask layer covers surfaces of the nitride semiconductor pillar layer and the epitaxy substrate.

In still another embodiment of the present invention, a method of manufacturing a nitride semiconductor substrate is provided. In the method, a patterned nitride semiconductor pillar layer is formed on a surface of an epitaxy substrate. The nitride semiconductor pillar layer has a plurality of first patterned arranged hollow structures and a plurality of second patterned arranged hollow structures located among the first patterned arranged hollow structures. Here, the second patterned arranged hollow structures have nano dimensions. Next, a mask layer is formed on a sidewall of the nitride semiconductor pillar layer and the surface of the epitaxy substrate. An ELOG process is then performed with use of the nitride semiconductor pillar layer as a seed so as to form the nitride semiconductor layer.

In order to the make aforementioned and other features and advantages of the present invention more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
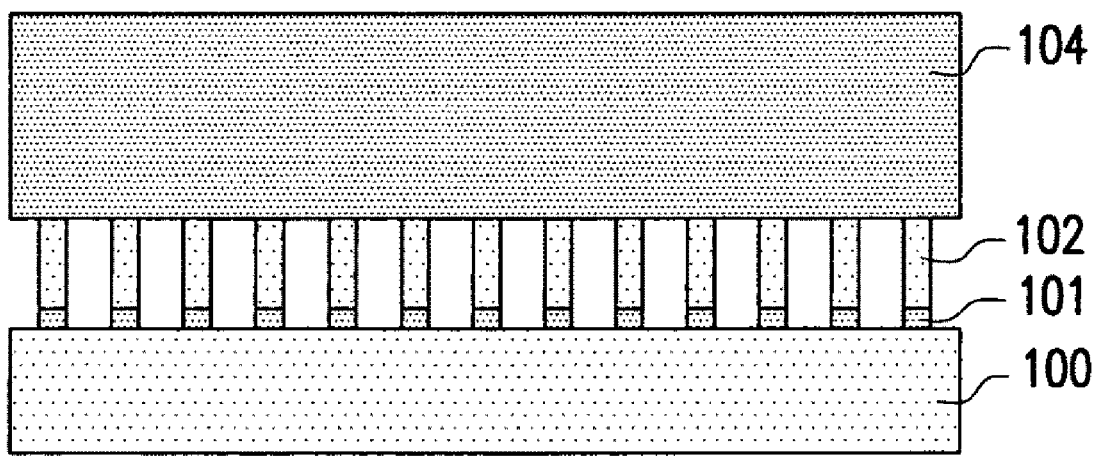
FIG. 1 is a simplified sectional view of a conventional nitride semiconductor substrate.
Figure 2:
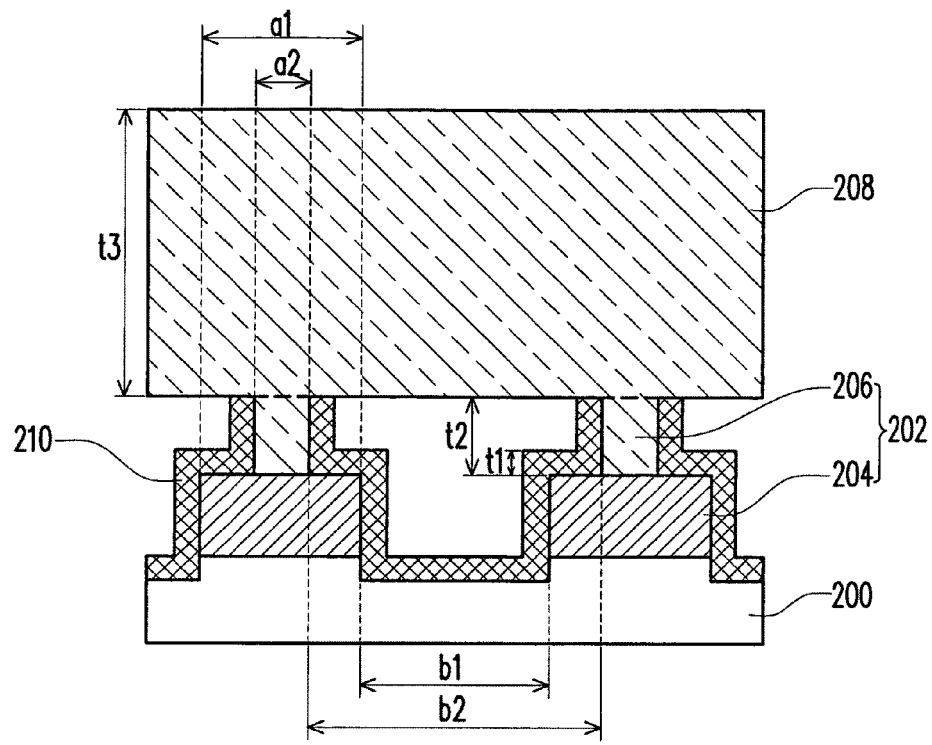
FIG. 2 is a simplified sectional view of a nitride semiconductor substrate according to a first embodiment of the present invention.

FIG. 2 is a simplified sectional view of a nitride semiconductor substrate according to a first embodiment of the present invention.

Referring to FIG. 2, the nitride semiconductor substrate in the first embodiment includes an epitaxy substrate 200, a nitride pillar layer 202 (containing a plurality of first patterned arranged pillars 204 and a plurality of second patterned arranged pillars 206), a nitride semiconductor layer 208, and a mask layer 210. Here, a material of the epitaxy substrate 200 is, for example, sapphire, silicon carbide, silicon, gallium arsenide, or other substrate materials suitable for implementing an epitaxy process. A material of the nitride pillar layer 202 is, for example, a III-nitride, such as nitride of boron, aluminum, gallium, indium, thallium or combination thereof. A thermal expansion coefficient of the epitaxy substrate 200 may be different from that of the nitride semiconductor layer 208. The nitride pillar layer 202 is formed on the epitaxy substrate 200, and the entire nitride semiconductor layer 208 is formed on the nitride pillar layer 202. The mask layer 210 covers surfaces of the first pillars 204, the second pillars 206, and the epitaxy substrate 200. Here, by performing a photolithography and etching process, the first pillars 204 and the second pillars 206 can have dimensions required for performing a subsequent separation process.

Referring to the cross-sections of the first pillars 204 and the second pillars 206 as depicted in FIG. 2, the first and the second pillars 204 and 206 appear to be in a block shape, while the first pillars 204 or the second pillars 206 can in fact have a stripe-shaped arrangement, a dot-shaped arrangement, or a meshed arrangement as a whole. Further, it can be observed from the cross-section in FIG. 2 that a hollow is formed between the first pillars 204 and the second pillars 206 by the mask layer 210. A width of a cross-section a2 of each of the second pillars 206 is smaller than a width of a cross-sectional of each of the first pillars 204, and a distance b2 among adjacent two of the second pillars 206 is greater than a distance b1 among adjacent two of the first pillars 204. Hence, in subsequent processes, the thickness of the nitride semiconductor layer 208 is increased, and strength of the nitride semiconductor layer 208 gradually becomes sufficient. As such, when the surrounding temperature is decreased, a freestanding nitride semiconductor substrate is automatically separated from the interface (the weakest section) between the epitaxy substrate 200 and the nitride pillar layer 202 (containing the first pillars 204 and the second pillars 206) due to the difference in thermal expansion coefficients of the epitaxy substrate 200 and the nitride pillar layer 202. In other words, a freestanding nitride semiconductor substrate is spontaneously separated from any interface between the second pillars 206 and the nitride semiconductor layer 208.

For instance, by performing the photolithography and etching process, the cross-sectional of each of the first pillars 204, the cross-section a2 of each of the second pillars 206, the distance b1 among adjacent two of the first pillars 204, and the distance b2 among adjacent two of the second pillars 206 can have dimensions required for performing the subsequent separation process. To better describe the present invention, a ratio of the cross-sectional of each of the first pillars 204 to the distance b1 among adjacent two of the first pillars 204 and a ratio of the cross-section a2 of each of the second pillars 206 to the distance b2 among adjacent two of the second pillars 206 are respectively defined as a fill factor FF. Namely, $FF1=a1/b1$, and $FF2=a2/b2$. For instance, in the present embodiment, FF1 may be less than or equal to 1 and FF2 may be less than or equal to 0.8, preferably FF1 is about 0.75 and FF2 is about 0.6. The dimensions and ratios of the above-referenced components are simply exemplary and should not be construed as limitations of the present invention. Person having ordinary skill in the pertinent art are able to modify and fulfill the present invention by applying the existing technology. For instance, the cross-sectional of each of the first pillars 204 ranges from 2.1 µm to 4.2 µm approximately, and the cross-section a2 of each of the second pillars 206 ranges from 1.3 µm to 3.6 µm approximately. In addition, if the nitride pillar layer 202 and the nitride semiconductor layer 208 are not separated, it may be accomplished by adjusting FF1 and FF2 appropriately, for example, FF1 may be more than 1; FF2 may be more than 0.8.

According to an embodiment of the present invention, a thickness of the nitride semiconductor layer 208 can be adjusted in the manufacturing process based on actual demands. For example, when a thickness t3 of the nitride semiconductor layer 208 is greater than 100 µm, a freestanding nitride semiconductor substrate can be formed by performing a separation process on the nitride semiconductor layer 208. Alternatively, as indicated in FIG. 3 below, a thin film can be formed.

Figure 3:
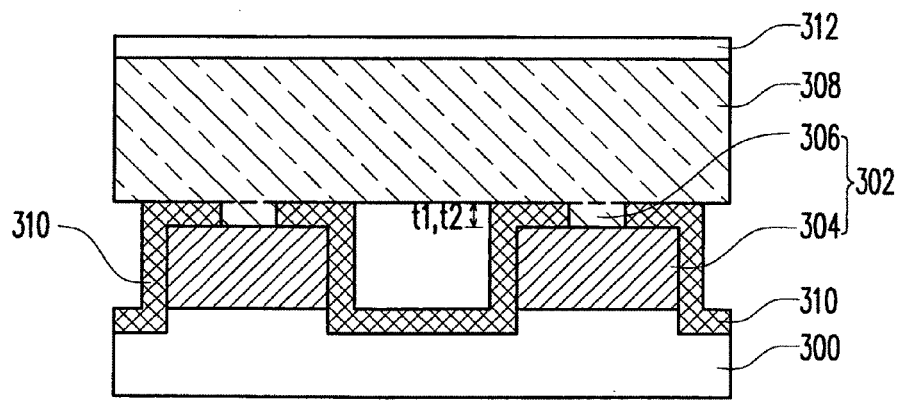
FIG. 3 is a simplified sectional view of a nitride semiconductor substrate according to a second embodiment of the present invention.

FIG. 3 is a simplified sectional view of a nitride semiconductor substrate according to a second embodiment of the present invention.

Referring to FIG. 3, the nitride semiconductor substrate in the second embodiment includes an epitaxy substrate 300, a nitride pillar layer 302 (containing a plurality of first patterned arranged pillars 304 and a plurality of second patterned arranged pillars 306), a nitride semiconductor layer 308, and a mask layer 310. Materials and dimensions of the components described herein are identical or similar to those discussed in the first embodiment, while the difference therebetween lies in that a thickness t1 of each of the second pillars 306 is equal to a thickness t2 of the mask layer 310. Hence, a contact area between the nitride semiconductor layer 308 and the underlying mask layer 310 is large, which is conducive to formation of the nitride semiconductor layer 308 in the form of a thin film. It is likely for the nitride semiconductor layer 308 discussed herein not to be separated from the epitaxy substrate 300. Instead, elements 312 (e.g. LEDs or Laser elements) can be directly formed on a surface of the nitride semiconductor layer 308 in subsequent processes. Moreover, the epitaxy substrate 300 and the nitride semiconductor layer 308 can be separated from each other by applying an existing technique in the last step.

FIGS. 4A to 4I are sectional views illustrating a process of manufacturing a nitride semiconductor substrate according to a third embodiment of the present invention.

Figure 4A:
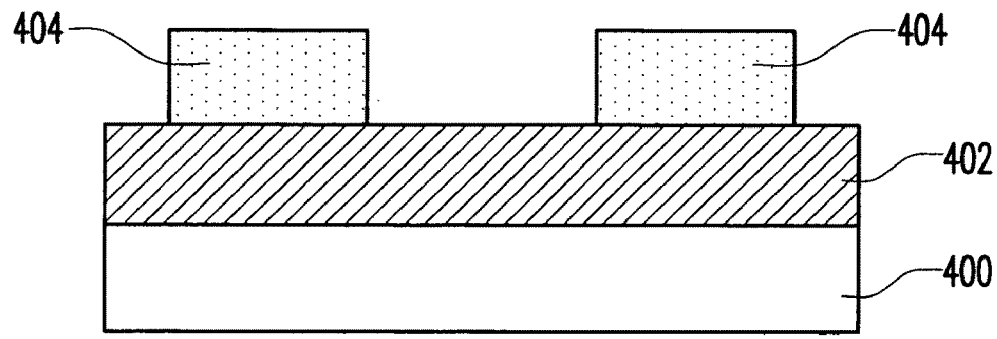
FIGS. 4A to 4I are sectional views illustrating a process of manufacturing a nitride semiconductor substrate according to a third embodiment of the present invention.
Figure 4B:
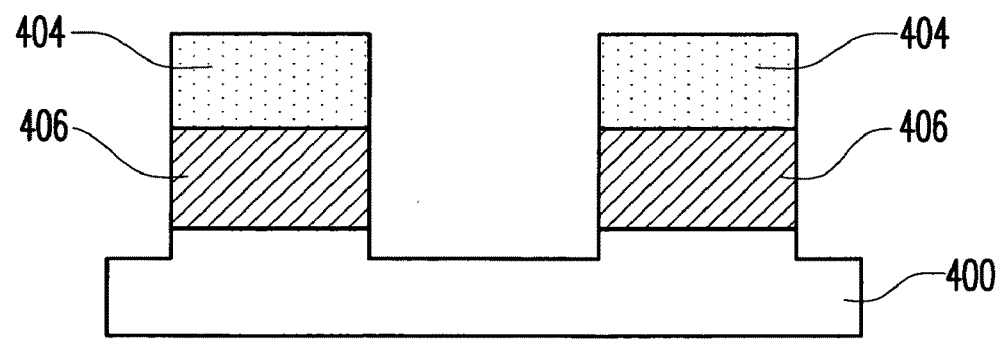

First, a plurality of first patterned arranged pillars is formed on a surface of the epitaxy substrate 400, which is shown in FIGS. 4A to 4B according to the third embodiment. Referring to FIG. 4A, a material layer 402 is formed on the surface of the epitaxy substrate 400. A material of the epitaxy substrate 400 is, for example, sapphire, silicon carbide, silicon, gallium arsenide, or other substrate materials suitable for implementing an epitaxy process. The material layer 402 is, for example, made of III-nitride, such as nitride of boron, aluminum, gallium, indium, thallium or combination thereof. Besides, a thickness of the material layer 402 ranges from 3 μm to 5 μm. Next, a patterned mask 404 is formed on the material layer 402, and a portion of a surface of the material layer 402 is exposed. Here, the patterned mask 404 is, for example, made of silicon nitride or photoresist.

Thereafter, referring to FIG. 4B, the material layer 402 is removed by using the patterned mask 404 as a mask, such that a plurality of first patterned arranged pillars 406 is formed. Here, the step of removing the material layer 402 can include removing a portion of the epitaxy substrate 400. After that, if it is deemed necessary, a plurality of regular or irregular nano-scale pillar structures can be formed by performing an etching process on the first pillars 406. This is conducive to release of material stresses and further reduction of dislocation density.

Figure 4C:
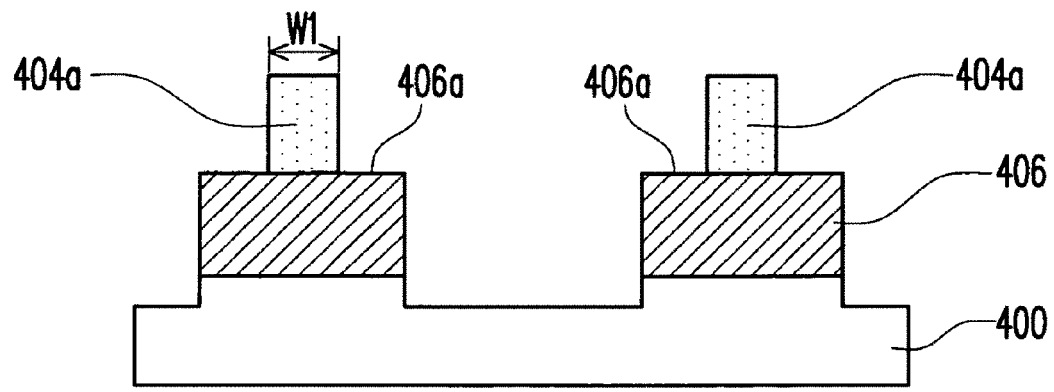

Afterwards, in order to form a mask layer on the surface of the epitaxy substrate 400, the process depicted in FIGS. 4C to 4G is performed in the third embodiment. Referring to FIG. 4C, the patterned mask 404 depicted in FIG. 4B is etched to reduce a width of the patterned mask 404, such that a patterned mask 404a having a width W1 is formed. Here, parts of top surfaces 406a of the first pillars 406 which are not covered by the patterned mask 404a are exposed.

Figure 4D:
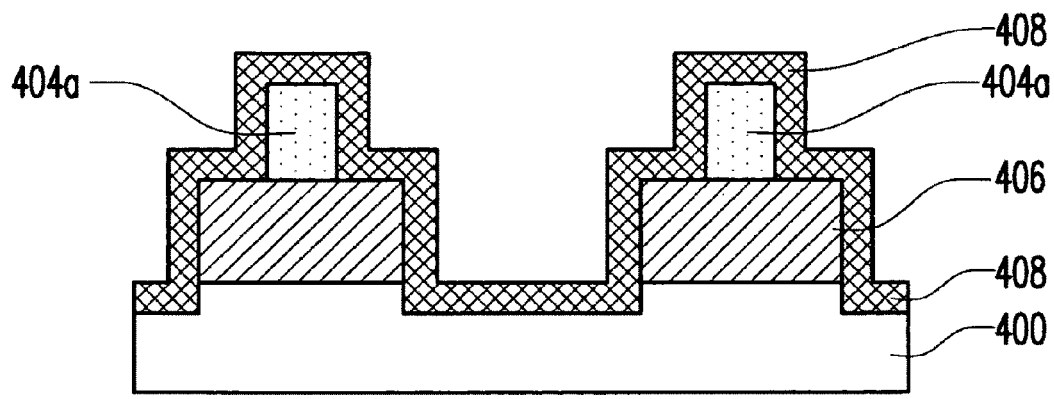

Next, referring to FIG. 4D, a thin film 408 is formed to entirely cover the patterned mask 404a, the first pillars 406, and a portion of the surface of the epitaxy substrate 400. The thin film 408 is, for example, made of silicon nitride, silicon oxide, metal tungsten, and so forth.

Figure 4E:
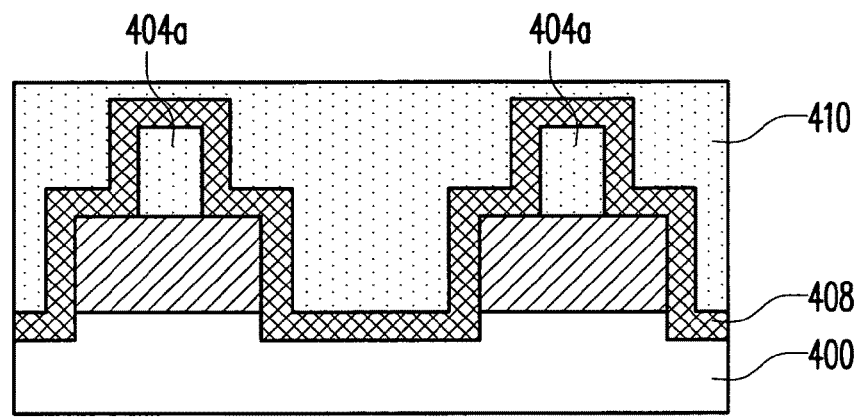

Thereafter, referring to FIG. 4E, in order to remove the thin film 408 on the patterned mask 404a, a photoresist layer 410 can be formed to entirely cover the thin film 408.

Figure 4F:
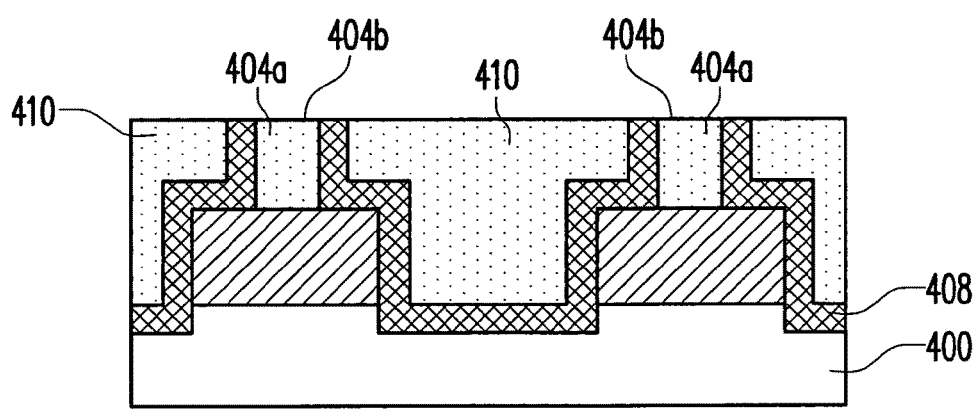

Referring to FIG. 4F, the photoresist layer 410 is then etched to expose the thin film 408 on a top surface 404b of the patterned mask 404a. The exposed thin film 408 is then removed by using the photoresist layer 410 as a mask, such that the top surface 404b of the patterned mask 404a is exposed.

Figure 4G:
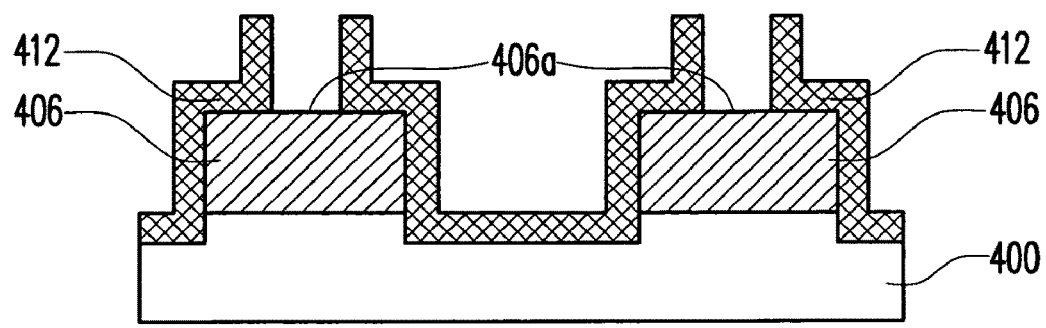

After that, referring to FIG. 4G, the patterned mask 404a and the photoresist layer 410 depicted in FIG. 4F are removed to expose parts of the top surfaces 406a of the first pillars 406. Thereby, a mask layer 412 covering the surface of the epitaxy substrate 400 and sidewalls and parts of the top surfaces 406a of the first pillars 406 is formed.

Figure 4H:
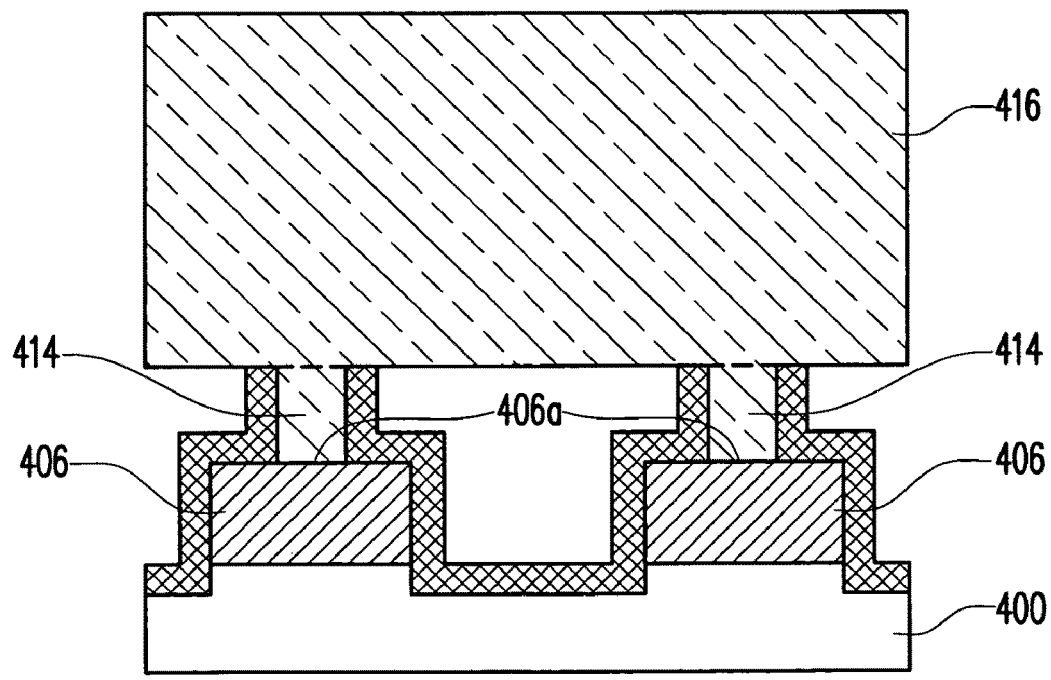

Next, referring to FIG. 4H, a plurality of second patterned arranged pillars 414 is epitaxially grown from parts of the top surfaces 406a of the first pillars 406. Here, a radius of each of the second pillars 414 is shorter than a width of a cross-section of each of the first pillars 406, and a distance among adjacent two of the second pillars 414 is greater than a distance among adjacent two of the first pillars 406. Here, a method of epitaxially growing the second pillars 414 is, for example, a hydride vapor-phase epitaxy (HVPE) method, a metal organic vapor-phase epitaxy (MOVPE) method, or a molecular beam epitaxy (MBE) method. The second pillars 414 are, for example, made of III-nitride, such as nitride of boron, aluminum, gallium, indium, thallium or combination thereof. Preferably, the second pillars 414 and the first pillars 406 are made of the same material. The cross-sections of the first pillars 406 and the second pillars 414 are shown, and therefore the first and the second pillars 406 and 414 appear to have a block shape. However, the first pillars 406 or the second pillars 414 can in fact have a stripe-shaped arrangement, a dot-shaped arrangement, or a meshed arrangement as a whole. An ELOG process is then performed on the second pillars 414 to form a nitride semiconductor layer 416 made of gallium nitride (GaN), aluminum nitride (AlN), gallium indium nitride (GaInN), aluminum gallium nitride (AlGaN), or aluminum gallium indium nitride (AlGaInN), for example. The ELOG process is, for example, an HVPE process, an MOVPE process, or an MBE process.

Figure 4I:
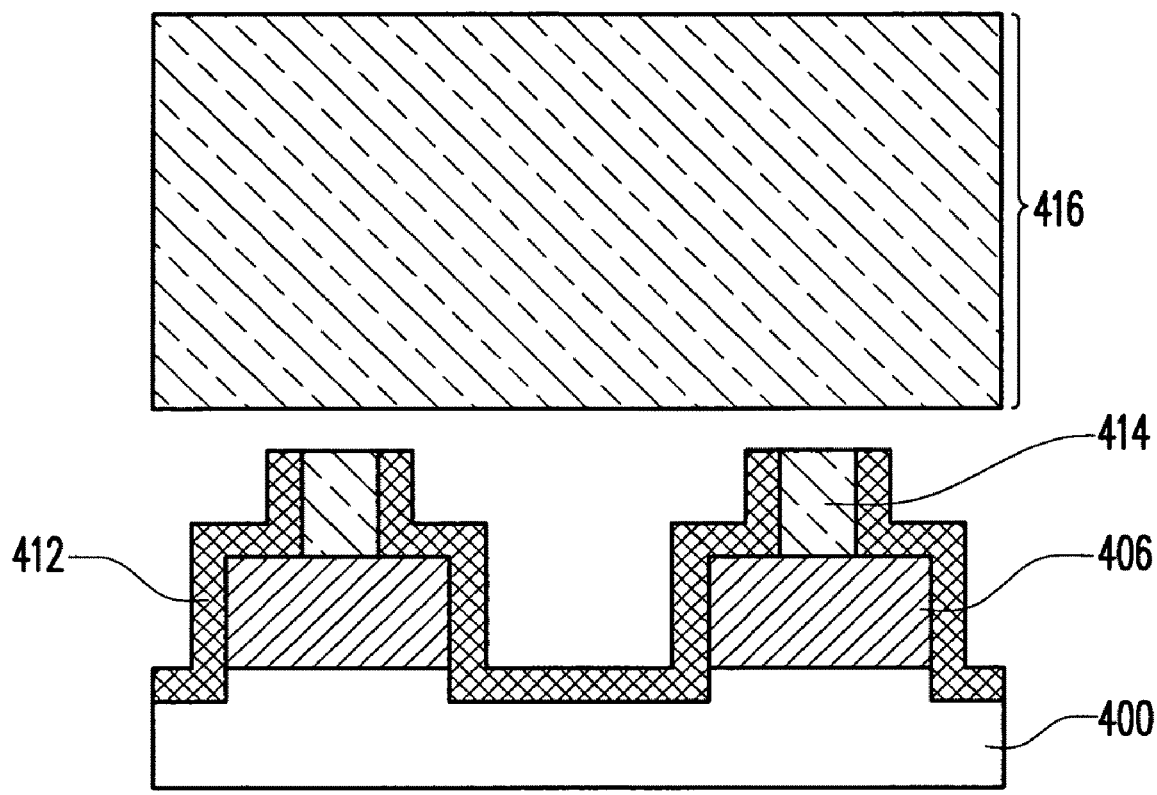

Finally, referring to FIG. 4I, when a thickness of the nitride semiconductor layer 416 is equal to or greater than 100 μm, a cooling process can be selectively performed to separate the nitride semiconductor layer 416 from the surface of the epitaxy substrate 400 as indicated in FIG. 4I. Owing to shear stresses which are caused by a difference in thermal expansion coefficients of the epitaxy materials, an interface which is located between the second pillars 414 and the nitride semiconductor layer 416 and has a weak structural strength is automatically cracked.

In addition to the fabrication process described in the third embodiment, other fabrication processes can be carried out in the present invention as discussed in the next embodiment.

FIGS. 5A to 5H are sectional views illustrating a process of manufacturing a nitride semiconductor substrate according to a fourth embodiment of the present invention.

Figure 5A:
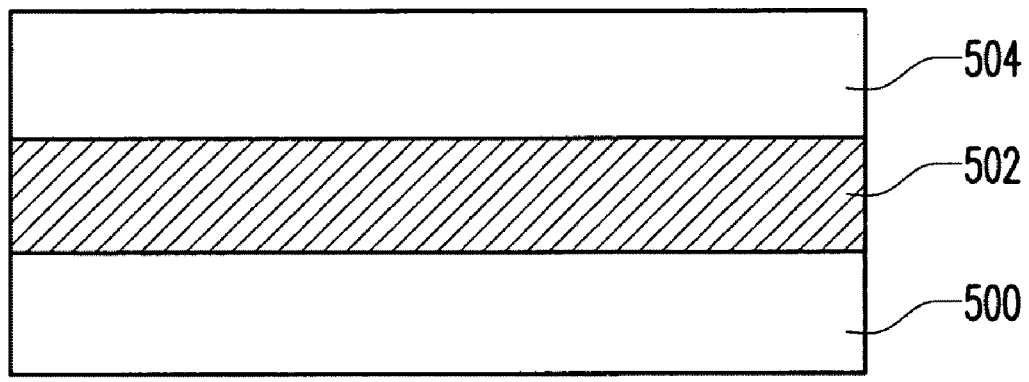
FIGS. 5A to 5H are sectional views illustrating a process of manufacturing a nitride semiconductor substrate according to a fourth embodiment of the present invention.

First, a plurality of first patterned arranged pillars is formed on a surface of a epitaxy substrate 500, which is shown in FIGS. 5A to 5D according to the fourth embodiment. Referring to FIG. 5A, a material layer 502 and a separation layer 504 are sequentially formed on the surface of the epitaxy substrate 500. Here, the material layer 502 is, for example, made of III-nitride, such as nitride of boron, aluminum, gallium, indium, thallium or combination thereof. A thickness of the material layer 502 ranges from 3 μm to 5 μm, for example.

Besides, the separation layer 504 can be made of a material suitable for being wet-etched, such as metal oxide (e.g. indium tin oxide), and a thickness of the separation layer 504 ranges from 100 nm to 200 nm, for example.

Figure 5B:
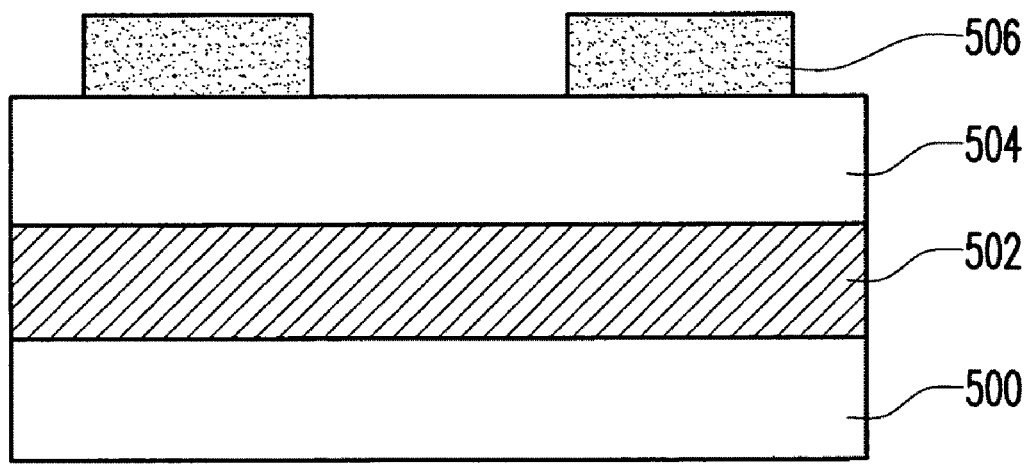

Next, referring to FIG. 5B, a patterned mask 506 is formed on the separation layer 504, and a portion of a surface of the separation layer 504 is exposed. Here, the patterned mask 506 is, for example, made of silicon nitride or photoresist.

Figure 5C:
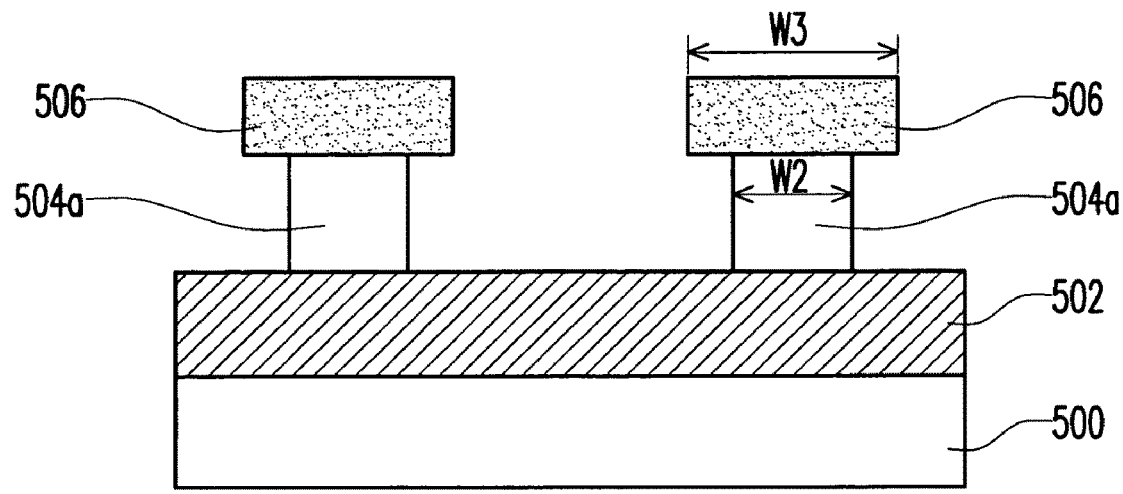

Thereafter, referring to FIG. 5C, the separation layer 504 is removed by using the patterned mask 506 as a mask. Further, the separation layer 504 is etched to reduce a width thereof, such that a patterned separation layer 504a having a width W2 is formed. Here, the width W2 of the patterned separation layer 504a is less than a width W3 of the patterned mask 506.

Figure 5D:
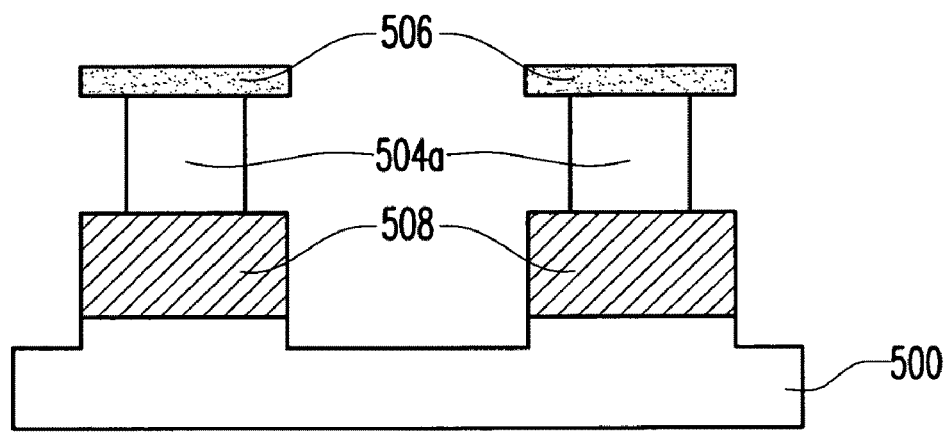

After that, referring to FIG. 5D, the material layer 502 illustrated in FIG. 5C is removed by using the patterned mask 506 as the mask, such that a plurality of first patterned arranged pillars 508 is formed. A method of removing the material layer 502 is, for example, an anisotropic etching method. Moreover, in the step of removing the material layer 502, a portion of the epitaxy substrate 500 can also be removed to ensure that the first pillars 508 are not connected to one another.

Figure 5E:
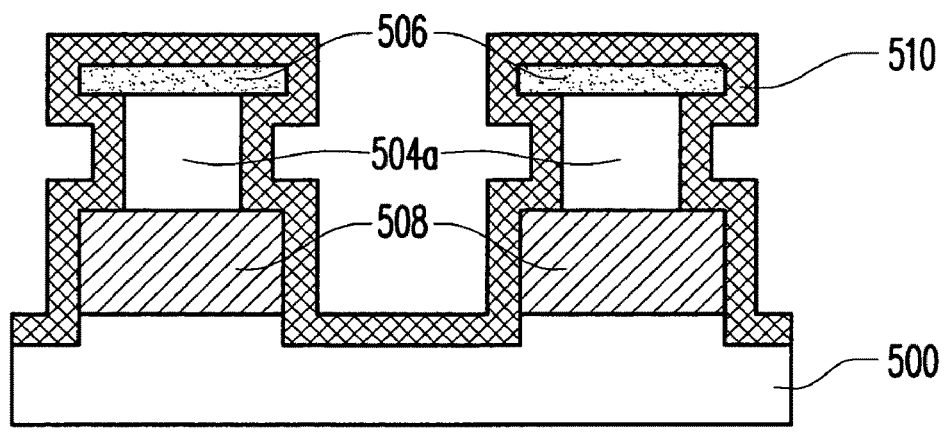
Figure 5F:
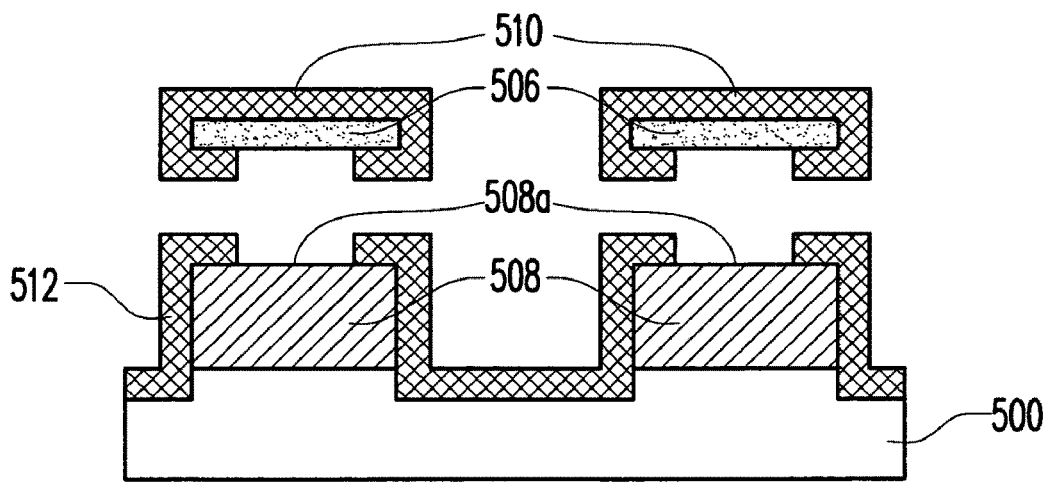

Next, in order to form a mask layer on the surface of the epitaxy substrate 500, referring to FIGS. 5E to 5F, a thin film 510 is formed to entirely cover the patterned mask 506, the separation layer 504a, the first pillars 508, and a portion of the surface of the epitaxy substrate 500. The thin film 510 is, for example, made of silicon nitride, silicon oxide, metal tungsten, and so forth.

As shown in FIG. 5F, the separation layer 504a is then removed to peel off the patterned mask 506 and a portion of the thin film 510, such that a mask layer 512 is formed, and that parts of top surfaces 508a of the first pillars 508 are exposed.

Figure 5G:
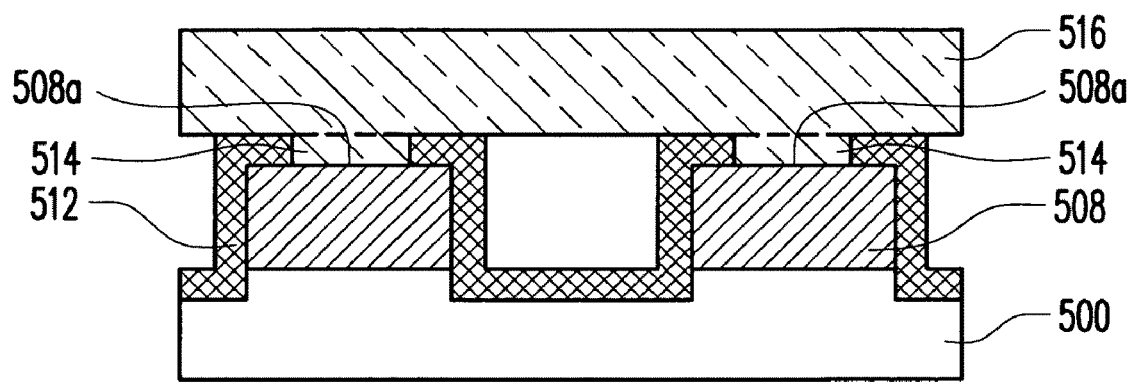

Afterwards, referring to FIG. 5G, a plurality of second patterned arranged pillars 514 is epitaxially grown from parts of the top surfaces 508a of the first pillars 508 by conducting an HVPE method, an MOVPE method, or an MBE method, for example. The second pillars 514 are, for example, made of nitride, such as gallium nitride, aluminum nitride, aluminum gallium nitride, and so on. Preferably, the second pillars 514 and the first pillars 508 are made of the same material. An ELOG process is then performed on the second pillars 514 to form a nitride semiconductor layer 516. Here, the ELOG process is, for example, an HVPE process, an MOVPE process, or an MBE process. The nitride semiconductor layer 516 is, for example, made of gallium nitride, aluminum nitride, gallium indium nitride, aluminum gallium nitride, or aluminum gallium indium nitride.

Figure 5H:
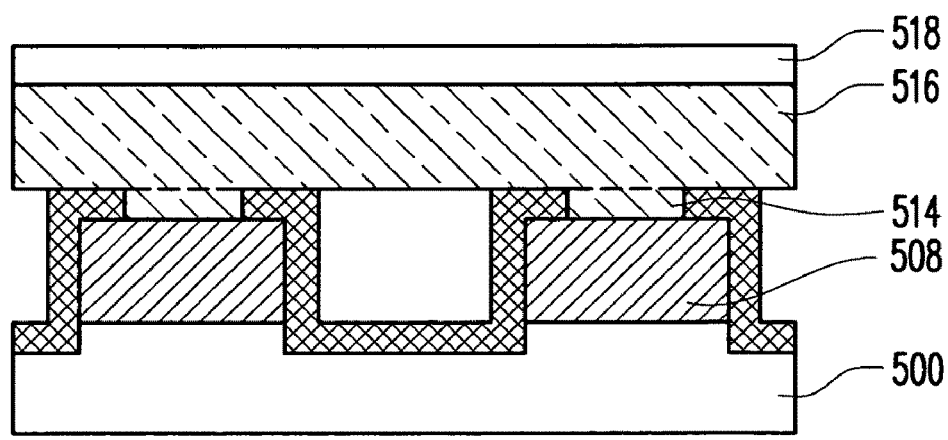

Finally, referring to FIG. 5H, the nitride semiconductor layer 516 formed in the fourth embodiment is adapted for forming a thin film, and it is possible for the nitride semiconductor layer 516 not to be separated from the hetero-substrate 500 and for the subsequent formation of elements 518 (e.g. LEDs or Laser elements). Moreover, other than the possibility that the nitride semiconductor layer 516 is not separated from the hetero-substrate 500, it is also likely for the nitride semiconductor layer 516 and the hetero-substrate 500 not to be separated from each other by applying an existing technique in the last step.

The finished structure may be separated or not in the first (or third) embodiment or the second (or fourth) embodiment theoretically. The determinant whether the finished structure is separated or not is at least one design of FF1, FF2 and the thickness of the nitride semiconductor layer. Therefore, the person having ordinary skill in the per can modify the parameters with regard to at least one design of FF1, FF2 and the thickness of the nitride semiconductor layer in order to fulfill the need of actual process, and no further description is provided herein.

Figure 6A:
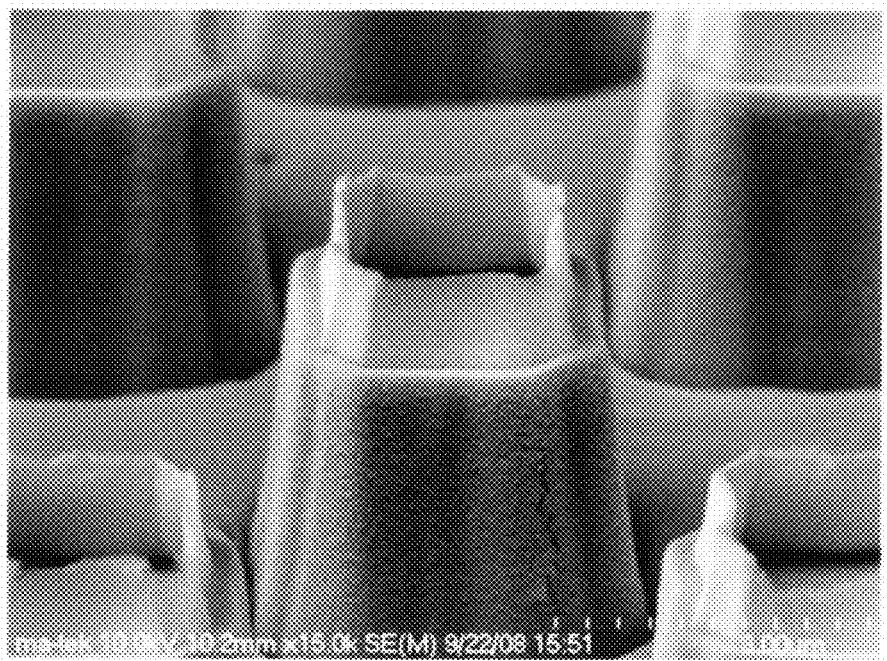
FIGS. 6A and 6B are SEM photographs respectively exhibiting a prototype sample made in accordance with the third embodiment and the fourth embodiment.
Figure 6B:
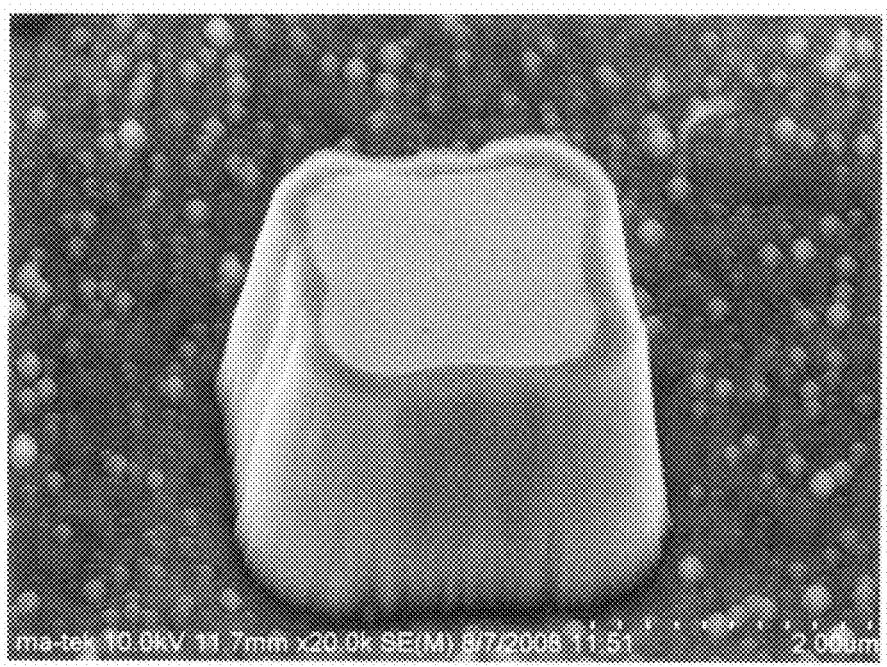

FIGS. 6A and 6B are SEM photographs respectively exhibiting a prototype sample made in accordance with the third embodiment and the fourth embodiment. Here, FIG. 6A is the SEM photograph substantially showing manufacturing steps up to those depicted in FIG. 4G according to the third embodiment, while FIG. 6B is the SEM photograph substantially showing manufacturing steps up to those depicted in FIG. 5F according to the fourth embodiment.

Figure 7A:
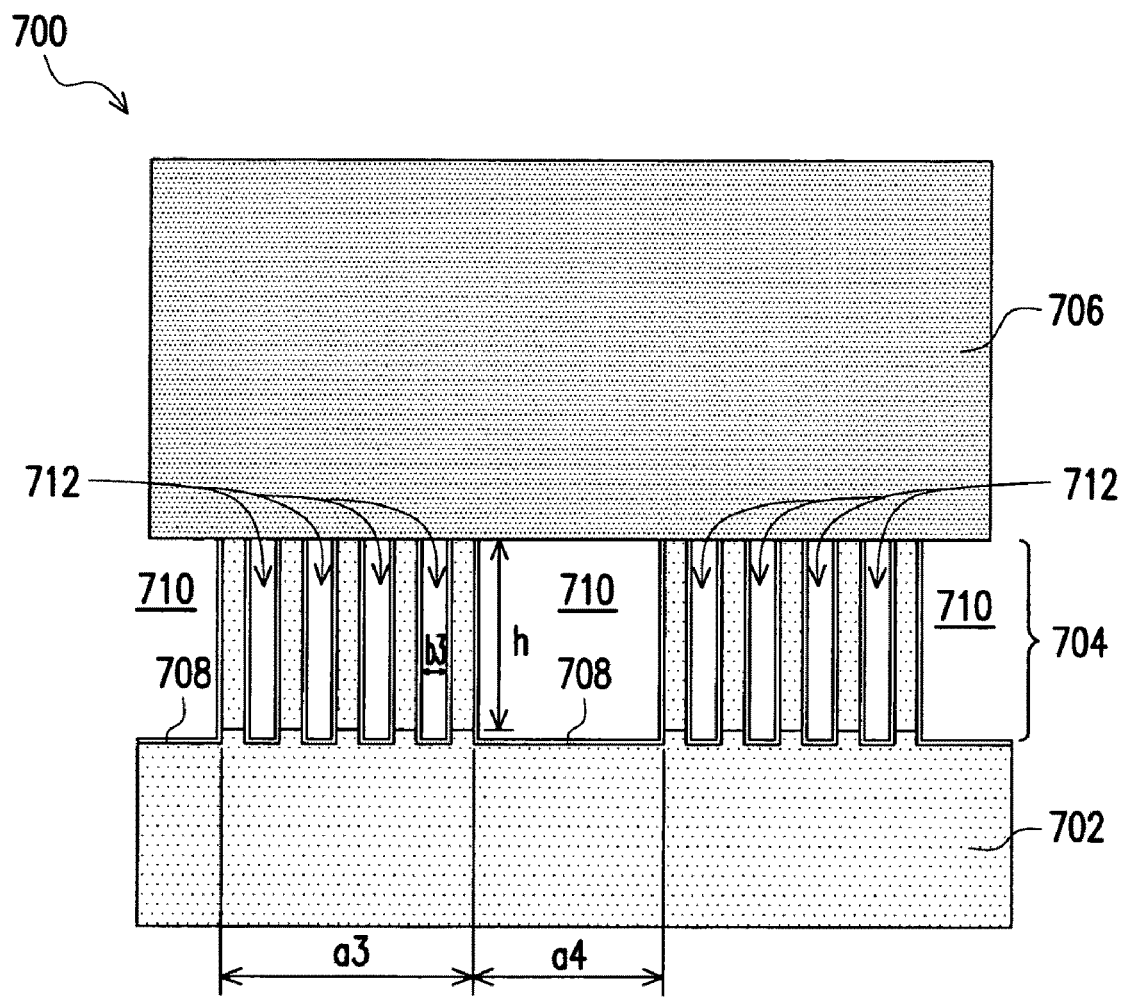
FIG. 7A is a simplified sectional view of another nitride semiconductor substrate according to an embodiment of the present invention.

FIG. 7A is a simplified sectional view of a nitride semiconductor substrate according to another embodiment of the present invention.

Referring to FIG. 7A, the nitride semiconductor substrate 700 includes an epitaxy substrate 702, a patterned nitride semiconductor pillar layer 704, a nitride semiconductor layer 706, and a mask layer 708. The nitride semiconductor pillar layer 704 is formed by a plurality of first patterned arranged hollow structures 710 and a plurality of second patterned arranged hollow structures 712, and the second hollow structures 712 have nano dimensions. For instance, a height and a width of the second hollow structures 712 respectively range from 1 μm to 5 μm and from 30 nm to 500 nm, for example. Besides, a height of the first hollow structures 710 ranges from 1 μm to 10 μm, for example. The dimensions and ratios disclosed herein are simply exemplary and should not be construed as limitations of the present invention. People having ordinary skill in the art are able to modify and fulfill the present invention by applying the existing technology. On the other hand, when observed from the cross-section, the first hollow structures 710 are cyclically arranged, while the second hollow structures 712 are regularly arranged or randomly arranged. Additionally, the first hollow structures 710 can have a stripe-shaped arrangement, a dot-shaped arrangement, or a meshed arrangement as a whole.

Here, a material of the epitaxy substrate 702 is, for example, sapphire, silicon carbide, silicon, gallium arsenide, or other substrate materials suitable for implementing an epitaxy process. The nitride semiconductor pillar layer 704 is, for example, made of a III-nitride, such as nitride of boron, aluminum, gallium, indium, thallium or combination thereof. The nitride semiconductor pillar layer 704 is formed on the epitaxy substrate 702, and the entire nitride semiconductor layer 706 is formed on the nitride semiconductor pillar layer 704. The mask layer 708 covers surfaces of the nitride semiconductor pillar layer 704 and the epitaxy substrate 702. A material of the mask layer 708 can be a dielectric material, such as silicon oxide or silicon nitride.

Further, by modifying the fabrication process upon actual demands, the nitride semiconductor layer 706 can be in the form of a thick film or a thin film. For instance, when a thickness of the nitride semiconductor layer 706 is greater than 50 μm, a freestanding nitride semiconductor substrate can be formed by performing a separation process 714 on the nitride semiconductor layer 706. Here, the freestanding nitride semiconductor substrate includes the nitride semiconductor layer 706, the nitride semiconductor pillar layer 704, and the mask layer 708 on the surface of the nitride semiconductor pillar layer 704, as indicated in FIG. 7B.

Likewise, by performing a photolithography and etching process, a distance a3 among each of the first hollow structures 710 and a width of each of the first hollow structures can have dimensions required for implementing the separation process 714, and a height h and a width b3 of each of the second hollow structures 712 can have an irregular nano dimension. To better describe the present invention, a ratio of the distance a3 to the width a4 of the first hollow structures 710 is defined as a filler factor FF. Namely, FF=a3/a4. For instance, in the present embodiment, FF≦2 (e.g. FF=1), and the height h of the second hollow structures 712 can be 1 μm. The dimensions and ratios disclosed herein are simply exemplary and should not be construed as limitations of the present invention. People having ordinary skill in the pertinent art are able to modify and fulfill the present invention by applying the existing technology. For example, the distance a3 ranges from 1 μm to 10 μm (preferably from 1 μm to 5 μm), and the width b3 ranges from 30 nm to 500 nm (preferably from 30 nm~300 nm).

Figure 7B:
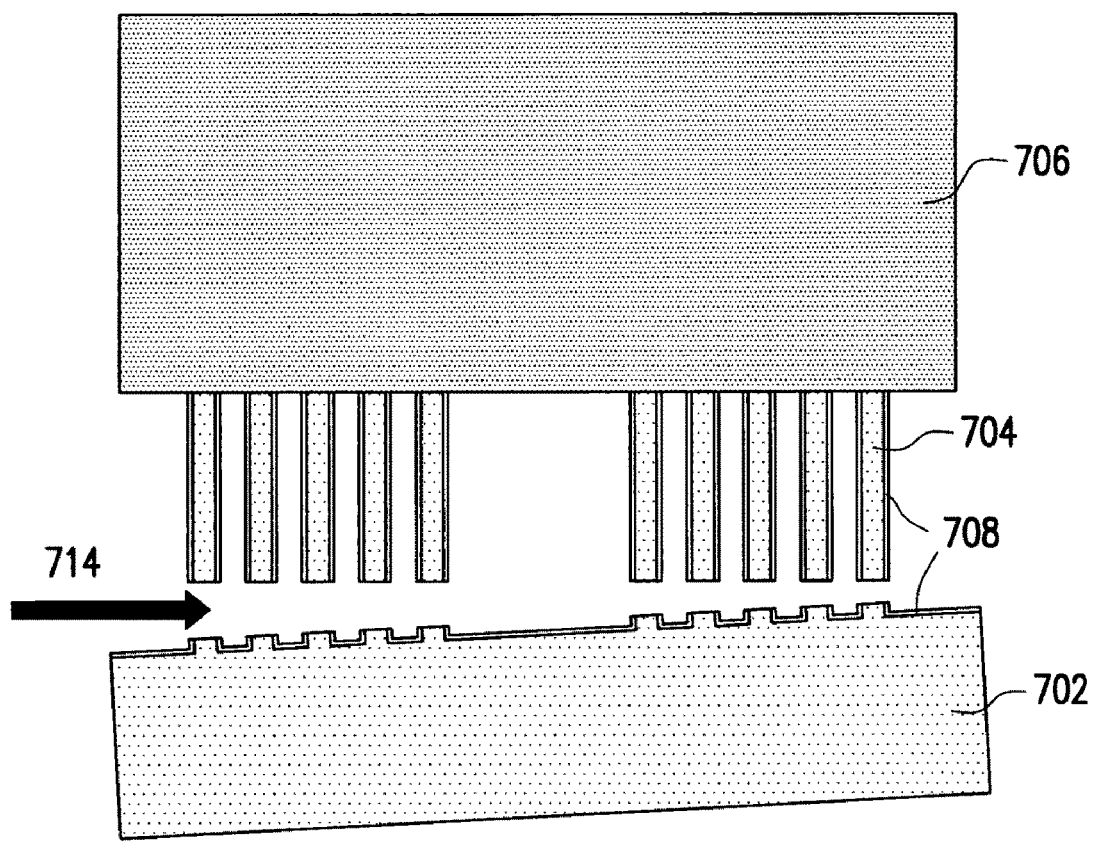
FIG. 7B is a schematic view illustrating that a nitride semiconductor freestanding substrate is formed by performing a separation process on the nitride semiconductor substrate depicted in FIG. 7A.

Referring to FIG. 7B, in subsequent processes, the thickness of the nitride semiconductor layer 706 is increased, and strength of the nitride semiconductor layer 706 gradually becomes sufficient. As such, when the surrounding temperature is decreased down to the room temperature, a freestanding nitride semiconductor substrate is automatically separated from the interface (the weakest section) between the epitaxy substrate 702 and the nitride semiconductor pillar layer 704 due to the difference in thermal expansion coefficients of the epitaxy substrate 702 and the nitride semiconductor pillar layer 704. In other words, a freestanding nitride semiconductor substrate is spontaneously separated from an interface between the epitaxy substrate 702 and the patterned nitride semiconductor pillar layer 704.

In addition, given that the nitride semiconductor layer 706 is in a form of a thin film (e.g. a thickness of the nitride semiconductor layer 706 is less than 50 μm), the nitride semiconductor substrate 700 depicted in FIG. 7A can serve as a nitride template. Similarly, through properly setting the FF value and the height h, e.g., FF≧0.5 and h≦5 μm, the dislocation density can be reduced, and the nitride semiconductor layer 706 is thus not cracked.

FIGS. 8A to 8H are sectional views illustrating a process of manufacturing another nitride semiconductor substrate according to an embodiment of the present invention.

Figure 8A:
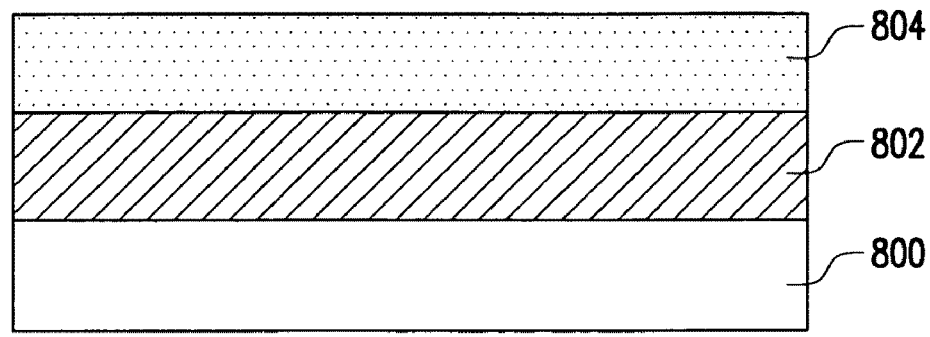
FIGS. 8A to 8H are sectional views illustrating a process of manufacturing another nitride semiconductor substrate according to an embodiment of the present invention.

First, referring to FIG. 8A, a nitride semiconductor material layer 802 is formed on a surface of an epitaxy substrate 800. A material of the epitaxy substrate 800 is, for example, sapphire, silicon carbide, silicon, gallium arsenide, or other substrate materials suitable for implementing an epitaxy process. The nitride semiconductor material layer 802 is, for example, made of a III-nitride, such as nitride of boron, aluminum, gallium, indium, thallium or combination thereof. A thickness of the nitride semiconductor material layer 802 ranges from 1 μm to 10 μm, for example. Additionally, a method of forming the nitride semiconductor material layer 802 on the surface of the epitaxy substrate 800 is, for example, an HVPE method, an MOVPE method, or an MBE method. Next, a photoresist layer 804 is formed on the nitride semiconductor material layer 802.

Figure 8B:
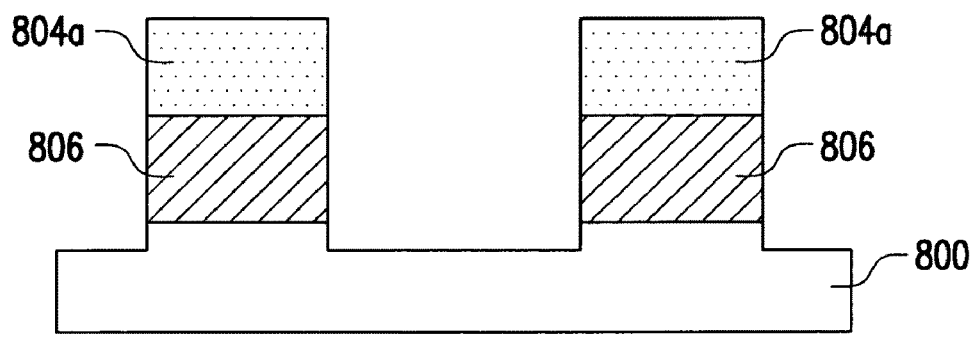

Thereafter, referring to FIG. 8B, by applying a photolithography technique or the like, the photoresist layer 804 is developed, and a patterned photoresist layer 804a exposing a portion of a surface of the nitride semiconductor material layer 802 is formed. After that, the nitride semiconductor material layer 802 is removed by performing a reactive ion etching (RIE) process or an inductive coupling plasma (ICP) etching process with use of the patterned photoresist layer 804a as a mask, such that a nitride semiconductor pattern layer 806 is formed. Besides, a portion of the epitaxy substrate 800 can also be removed in the step of removing the nitride semiconductor material layer 802.

Figure 8C:
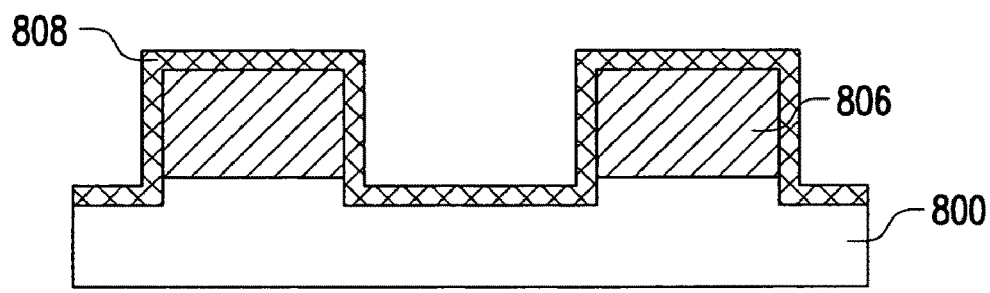

Afterwards, referring to FIG. 8C, the patterned photoresist layer 804a is removed (as shown in FIG. 8B), and a sacrificial mask layer 808 is formed on surfaces of the nitride semiconductor pattern layer 806 and the epitaxy substrate 800. The sacrificial mask layer 808 covers the surface of the nitride semiconductor pattern layer 806. Here, the sacrificial mask layer 808 can be made of a dielectric material, such as silicon oxide or silicon nitride.

Figure 8D:
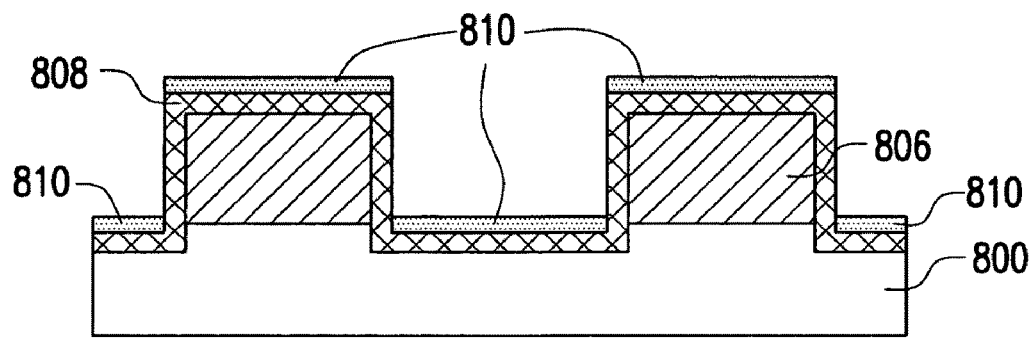

Referring to FIG. 8D, a metal thin film 810 is then formed on a surface of the sacrificial mask layer 808 but is not formed on sidewalls of the sacrificial mask layer 808. In the present embodiment, the metal thin film 810 is metal nickel, for example.

Figure 8E:
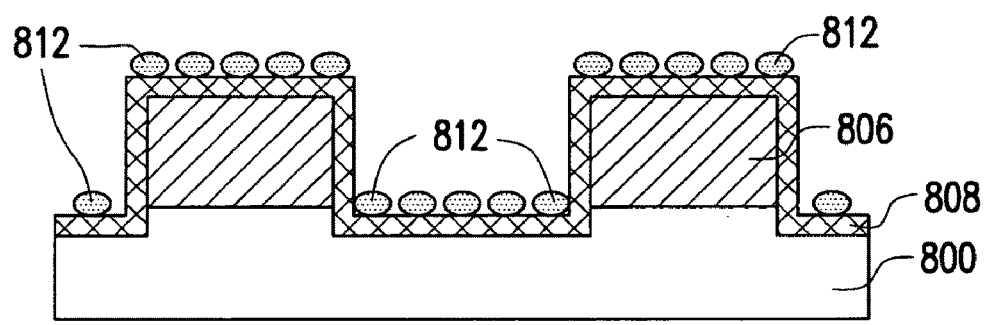

Next, referring to FIG. 8E, a high temperature annealing process is performed at 850° C., for example. Thereby, the metal thin film 810 is automatically transformed into a plurality of ball-shaped metals aggregated together due to surface tension difference in materials. A radius of each of the ball-shaped metals ranges from 30 nm to 500 nm, for example. Besides, a patterned mask layer 812 (the ball-shaped metals) is formed on the surface of the sacrificial mask layer 808, and the patterned mask layer 812 has nano-sized patterns.

Figure 8F:
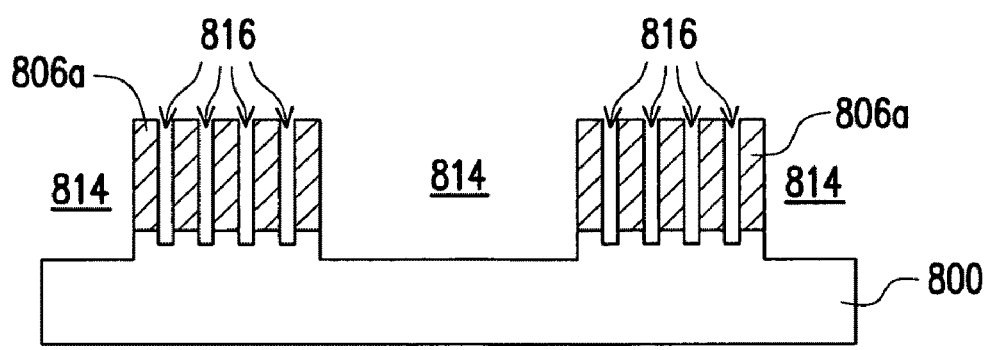

Afterwards, referring to FIG. 8F, the sacrificial mask layer 808 and the nitride semiconductor pattern layer 806 are etched by performing an anisotropic etching process (e.g., an RIE process or an ICP etching process) with use of the patterned mask layer 812 as a mask. Thereby, a nitride semiconductor pillar layer 806a containing a plurality of third patterned arranged hollow structures 814 and a plurality of fourth patterned arranged hollow structures 816 is formed. The nitride semiconductor pillar layer 806a is, for example, made of gallium nitride, aluminum nitride, aluminum gallium nitride, indium nitride, indium gallium nitride, or aluminum gallium indium nitride. The sacrificial mask layer 808 and the patterned mask layer 812 are then removed.

Figure 8G:
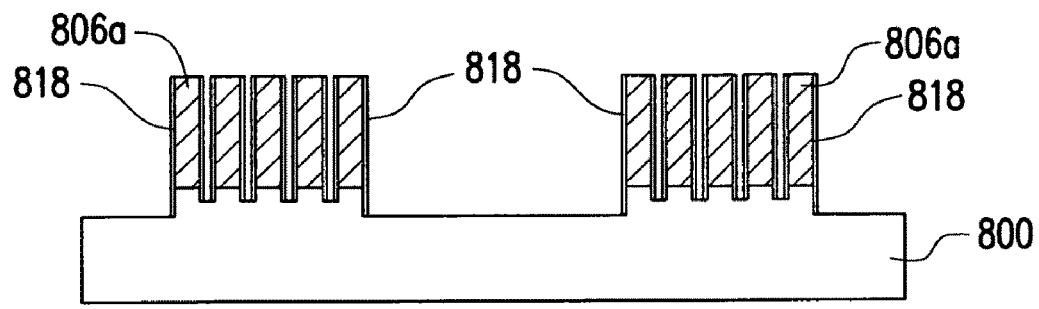

Thereafter, referring to FIG. 8G, a mask layer 818 is formed on sidewalls of the nitride semiconductor pillar layer 806a and on the surface of the epitaxy substrate 800. For instance, the mask layer 818 can be formed by first forming a dielectric thin film entirely covering the surfaces of the nitride semiconductor pillar layer 806a and the epitaxy substrate 800 and then removing the dielectric thin film located on a top surface of the nitride semiconductor pillar layer 806a. Here, the mask layer 818 can be made of a dielectric material, such as silicon oxide or silicon nitride.

Figure 8H:
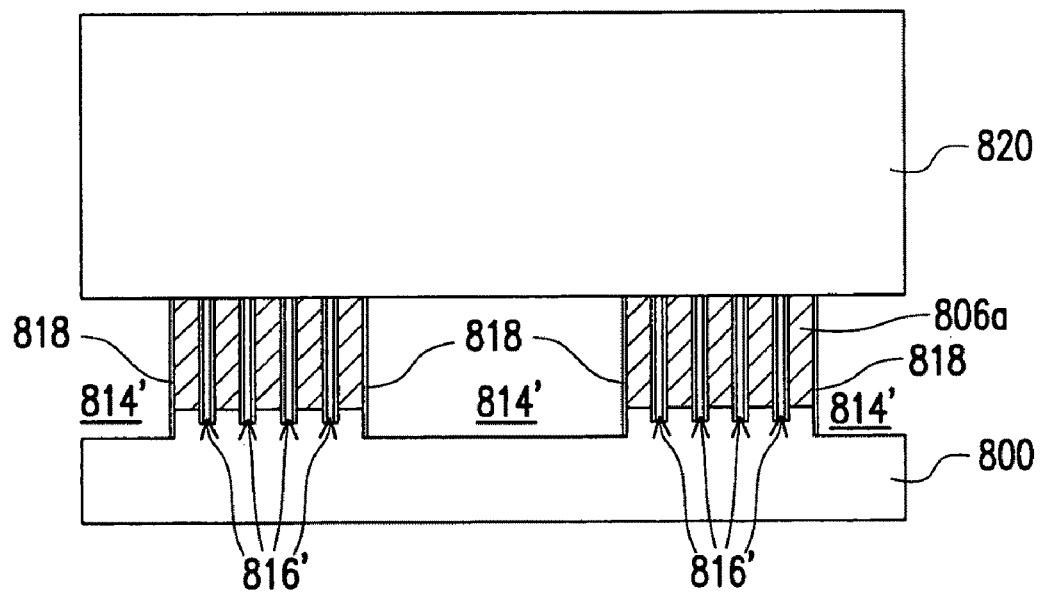

Next, referring to FIG. 8H, an ELOG process is performed by using the nitride semiconductor pillar layer 806a as a seed so as to form a nitride semiconductor layer 820 such that fifth hollow structures 814' and sixth hollow structures 816' shown in FIG. 8H are formed. The nitride semiconductor layer 820 is made of gallium nitride (GaN), aluminum nitride (AlN), indium nitride (InN), gallium indium nitride (GaInN), aluminum gallium nitride (AlGaN), or aluminum gallium indium nitride (AlGaInN), for example. Based on actual demands, the ELOG process is, for example, an HVPE process, an MOVPE process, or an MBE process.

Figure 8I:
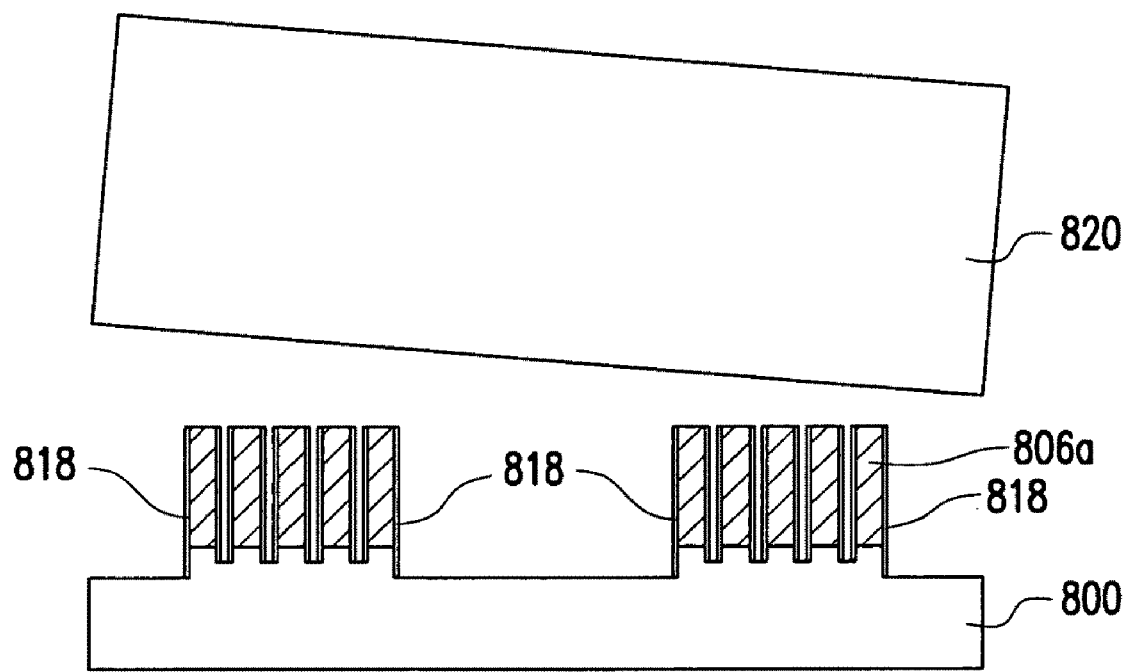
FIG. 8I is a sectional view illustrating a process of manufacturing a nitride semiconductor freestanding substrate according to an embodiment of the present invention.

If the thickness of the nitride semiconductor layer 820 is equal to or greater than 50 μm, a cooling process can be selectively performed for releasing shear stresses caused by difference in thermal expansion coefficients of epitaxy materials in the nitride semiconductor layer 820. Thereby, the interface (the weakest section, e.g. the nitride semiconductor layer 820) is automatically separated from the nitride semiconductor pillar layer 806a, as indicated in FIG. 8I.

In light of the foregoing, the interface between the nitride semiconductor layer and the substrate is formed by two layers of patterned arranged pillars in different sizes according to the present invention. Besides, the width of the cross-section of each of the second pillars near the nitride semiconductor layer is smaller than the width of the cross-section of each of the first pillars near the substrate, and the distance among each of the second pillars is greater than the distance among each of the first pillars. As such, the contact point between the GaN semiconductor layer and each of the second pillars is weakened and no longer able to withstand stresses, and the contact point is cracked to separate the GaN semiconductor layer from the substrate. In addition, when the nitride semiconductor thin film is applied according to the present invention, the small cross-section of each of the second pillars gives rise to a reduction of both dislocation of the epitaxy layer (i.e. the nitride semiconductor layer) and damages to light-emitting efficiency of the GaN semiconductor layer when the ELOG process is performed on the nitride semiconductor layer. Here, the damages to the light-emitting efficiency of the GaN semiconductor layer are caused by thermal stresses. Moreover, according to another embodiment of the present invention, the nitride semiconductor pillar layer containing a plurality of first patterned arranged hollow structure and a plurality of nano-sized second hollow structures. Thereby, the nitride semiconductor thin film can be grown by performing an ELOG process on the nitride semiconductor pillar layer, and dislocation of the epitaxy layer can be reduced. Additionally, the first and the second hollow structures are conducive to release of material stresses and thermal stresses, such that cracks of the nitride semiconductor layer and damages to the light-emitting efficiency of the nitride semiconductor layer can be both prevented. In case that the nitride semiconductor thick film is grown according to the present invention, not only the dislocation of the epitaxy layer can be reduced, but also the patterned nitride semiconductor pillar layer can be automatically separated in the cooling process. Namely, the shear stresses caused by the difference in thermal expansion coefficients of epitaxy materials are released, and thereby the weakest interface is automatically cracked. As such, a free-standing nitride semiconductor substrate is formed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A nitride semiconductor substrate, comprising: an epitaxy substrate; a plurality of nitride pillars formed on the epitaxy substrate to expose surfaces of the epitaxy substrate that are between the nitride pillars and to expose side and bottom surfaces of the epitaxial substrate, wherein the plurality of nitride pillars comprises: a plurality of first patterned arranged pillars, wherein each of the plurality of the first patterned arranged pillars viewed from a cross section is a rectangle; and a plurality of second patterned arranged pillars formed on top of the first patterned arranged pillars, wherein a width of a cross-section of each of the second patterned arranged pillars is smaller than a width of a cross-section of each of the first patterned arranged pillars, and a distance among each of the second patterned arranged pillars is longer than a distance among each of the first patterned arranged pillars, wherein each of the plurality of the second patterned arranged pillars viewed from the cross section is a rectangle; a nitride semiconductor layer formed on top of the plurality of nitride pillars; and a mask layer covering all the exposed surfaces of the epitaxy substrate that are between the nitride pillars and covering vertical surfaces of the first patterned arranged pillars and vertical surfaces of the second patterned arranged pillars.

2. The nitride semiconductor substrate as claimed in claim 1, wherein a material of the nitride semiconductor layer comprises gallium nitride, aluminum nitride, gallium indium nitride, aluminum gallium nitride, or aluminum gallium indium nitride.

3. The nitride semiconductor substrate as claimed in claim 1, wherein a ratio of the width of the cross-section of each of the first patterned arranged pillars to the distance among each of the first patterned arranged pillars is more than 1.

4. The nitride semiconductor substrate as claimed in claim 1, wherein a ratio of the width of the cross-section of each of the second patterned arranged pillars to the distance among each of the second patterned arranged pillars is more than 0.8.

5. The nitride semiconductor substrate as claimed in claim 1, wherein a thickness of each of the second patterned arranged pillars is equal to a thickness of the mask layer.

6. The nitride semiconductor substrate as claimed in claim 1, wherein a material of the nitride pillar layer comprises a III-nitride.

7. The nitride semiconductor substrate as claimed in claim 6, wherein the III-nitride comprises nitride of boron, aluminum, gallium, indium, thallium or combination thereof.

8. The nitride semiconductor substrate as claimed in claim 1, wherein a material of the epitaxy substrate comprises sapphire, silicon carbide, silicon, or gallium arsenide.

9. The nitride semiconductor substrate as claimed in claim 1, wherein the first patterned arranged pillars or the second patterned arranged pillars has a stripe-shaped arrangement, a dot-shaped arrangement, or a meshed arrangement.

10. The nitride semiconductor substrate as claimed in claim 1, wherein a thermal expansion coefficient of the nitride semiconductor layer is different from a thermal expansion coefficient of the epitaxy substrate.

11. The nitride semiconductor substrate as claimed in claim 1, wherein a nitride semiconductor freestanding substrate is formed by performing a separation process on the nitride semiconductor substrate when a thickness of the nitride semiconductor layer is more than 100 µm.

12. The nitride semiconductor substrate as claimed in claim 1, wherein a ratio of the width of the cross-section of each of the first patterned arranged pillars to the distance among each of the first patterned arranged pillars is less than or equal to 1.

13. The nitride semiconductor substrate as claimed in claim 1, wherein a ratio of the width of the cross-section of each of the second patterned arranged pillars to the distance among each of the second patterned arranged pillars is less than or equal to 0.8.

* * * * *